US009653568B2

(12) United States Patent
Laven et al.

(10) Patent No.: US 9,653,568 B2
(45) Date of Patent: May 16, 2017

(54) METHOD OF MANUFACTURING AN INSULATED GATE BIPOLAR TRANSISTOR WITH MESA SECTIONS BETWEEN CELL TRENCH STRUCTURES

(71) Applicant: Infineon Technologies AG, Neubiberg (DE)

(72) Inventors: Johannes Georg Laven, Taufkirchen (DE); Alexander Philippou, Munich (DE); Hans-Joachim Schulze, Taufkirchen (DE); Christian Jaeger, Munich (DE); Roman Baburske, Otterfing (DE); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/734,723

(22) Filed: Jun. 9, 2015

(65) Prior Publication Data
US 2015/0270369 A1      Sep. 24, 2015

Related U.S. Application Data

(62) Division of application No. 14/026,383, filed on Sep. 13, 2013, now Pat. No. 9,076,838.

(51) Int. Cl.
*H01L 29/06*       (2006.01)
*H01L 29/66*       (2006.01)
(Continued)

(52) U.S. Cl.
CPC .... *H01L 29/66348* (2013.01); *H01L 21/2236* (2013.01); *H01L 21/266* (2013.01);
(Continued)

(58) Field of Classification Search
CPC .......... H01L 29/66348; H01L 29/7395; H01L 29/7397; H01L 29/6634; H01L 29/7396;
(Continued)

(56) References Cited

U.S. PATENT DOCUMENTS

| 4,893,160 A | 1/1990 | Blanchard |
| 4,985,741 A | 1/1991 | Bauer et al. |

(Continued)

FOREIGN PATENT DOCUMENTS

| CN | 1726596 A | 1/2006 |
| CN | 1941417 A | 4/2007 |

(Continued)

OTHER PUBLICATIONS

Nakano, H et al., "600V trench-gate IGBT with Micro-P structure", 21st International Symposium on Power Semiconductor Devices & IC's, Barcelona, Jun. 14-18, 2009, pp. 132-135.

(Continued)

*Primary Examiner* — William F Kraig
*Assistant Examiner* — Pavel Ivanov
(74) *Attorney, Agent, or Firm* — Murphy, Bilak & Homiller, PLLC

(57) ABSTRACT

A method of manufacturing an insulated gate bipolar transistor includes providing trenches extending from a first surface to a layer section in a semiconductor portion, introducing impurities into mesa sections between the trenches, and forming, from the introduced impurities, second portions of doped regions separated from source regions by body regions. The source regions are electrically connected to an emitter electrode. The second portions have a second mean net impurity concentration exceeding at least ten times a first mean net impurity concentration in first portions of the doped layer. The first portions extend from the body regions to the layer section, respectively.

5 Claims, 15 Drawing Sheets

(51) Int. Cl.
  *H01L 29/739* (2006.01)
  *H01L 21/223* (2006.01)
  *H01L 21/265* (2006.01)
  *H01L 21/266* (2006.01)

(52) U.S. Cl.
  CPC .. *H01L 21/26513* (2013.01); *H01L 21/26586* (2013.01); *H01L 29/0696* (2013.01); *H01L 29/6634* (2013.01); *H01L 29/7395* (2013.01); *H01L 29/7396* (2013.01); *H01L 29/7397* (2013.01)

(58) Field of Classification Search
  CPC ............. H01L 29/0696; H01L 21/2236; H01L 21/26513; H01L 21/26586; H01L 21/266
  See application file for complete search history.

(56) References Cited

U.S. PATENT DOCUMENTS

| | | | |
|---|---|---|---|
| 5,366,914 A | 11/1994 | Takahashi et al. | |
| 5,751,024 A | 5/1998 | Takahashi | |
| 5,973,160 A | 10/1999 | Poss et al. | |
| 6,040,600 A | 3/2000 | Uenishi et al. | |
| 6,218,217 B1 | 4/2001 | Uenishi et al. | |
| 6,521,538 B2 | 2/2003 | Soga et al. | |
| 6,566,691 B1 | 5/2003 | Inoue et al. | |
| 6,710,403 B2 | 3/2004 | Sapp | |
| 6,750,508 B2 | 6/2004 | Omura et al. | |
| 6,800,897 B2 | 10/2004 | Baliga | |
| 6,882,004 B2 | 4/2005 | Zundel et al. | |
| 7,041,559 B2 | 5/2006 | Baliga | |
| 7,078,740 B2 | 7/2006 | Yamaguchi et al. | |
| 7,423,316 B2 | 9/2008 | Kawaji et al. | |
| 7,456,487 B2 | 11/2008 | Ogura et al. | |
| 7,546,487 B2 | 6/2009 | Marisetty et al. | |
| 7,675,113 B2 | 3/2010 | Sakamoto et al. | |
| 7,986,003 B2 | 7/2011 | Aono et al. | |
| 8,120,074 B2 | 2/2012 | Schulze et al. | |
| 8,178,701 B2 | 5/2012 | Selifonov | |
| 8,178,947 B2 | 5/2012 | Takahashi et al. | |
| 8,222,681 B2 | 7/2012 | Schulze et al. | |
| 8,299,539 B2 | 10/2012 | Kouno | |
| 8,319,314 B2 | 11/2012 | Ogura et al. | |
| 2002/0179976 A1 | 12/2002 | Takahashi | |
| 2004/0009643 A1* | 1/2004 | Blanchard | H01L 29/0634 438/268 |
| 2004/0014451 A1 | 1/2004 | Sapp et al. | |
| 2004/0079989 A1 | 4/2004 | Kaneko et al. | |
| 2004/0173813 A1 | 9/2004 | Chang | |
| 2006/0060916 A1 | 3/2006 | Girdhar et al. | |
| 2007/0194374 A1 | 8/2007 | Bhalla et al. | |
| 2007/0272978 A1 | 11/2007 | Mauder et al. | |
| 2008/0179662 A1 | 7/2008 | Hshieh | |
| 2008/0265315 A1 | 10/2008 | Mauder et al. | |
| 2009/0114982 A1 | 5/2009 | Saka et al. | |
| 2009/0140327 A1 | 6/2009 | Hirao et al. | |
| 2009/0206924 A1 | 8/2009 | Zeng et al. | |
| 2010/0078707 A1 | 4/2010 | Haeberlen et al. | |
| 2010/0171173 A1 | 7/2010 | Hsieh et al. | |
| 2010/0193796 A1 | 8/2010 | Nakano | |
| 2010/0258855 A1 | 10/2010 | Yilmaz et al. | |
| 2010/0289032 A1 | 11/2010 | Zhang et al. | |
| 2011/0101416 A1 | 5/2011 | Schulze et al. | |
| 2011/0248340 A1 | 10/2011 | Hsieh | |
| 2011/0254088 A1 | 10/2011 | Darwish et al. | |
| 2011/0298056 A1 | 12/2011 | Ning et al. | |
| 2011/0303925 A1* | 12/2011 | Nishimura | H01L 29/0878 257/77 |
| 2011/0316074 A1 | 12/2011 | Oota | |
| 2012/0025199 A1* | 2/2012 | Chen | H01L 27/1464 257/75 |
| 2012/0032258 A1 | 2/2012 | Zeng et al. | |
| 2012/0056241 A1 | 3/2012 | Sumitomo et al. | |
| 2012/0098030 A1 | 4/2012 | Schulze et al. | |
| 2012/0187474 A1 | 7/2012 | Rexer et al. | |
| 2012/0313139 A1 | 12/2012 | Matsuura et al. | |
| 2012/0319199 A1 | 12/2012 | Zeng et al. | |
| 2012/0322217 A1 | 12/2012 | Yeh et al. | |
| 2013/0248992 A1 | 9/2013 | Padmanabhan et al. | |
| 2014/0042525 A1 | 2/2014 | Darwish et al. | |
| 2014/0061719 A1 | 3/2014 | Takei | |
| 2014/0299932 A1 | 10/2014 | Blank | |
| 2014/0332844 A1* | 11/2014 | Ding | H01L 29/78 257/139 |
| 2015/0041962 A1 | 2/2015 | Laven et al. | |
| 2015/0076554 A1 | 3/2015 | Laven et al. | |
| 2015/0144988 A1 | 5/2015 | Laven et al. | |
| 2015/0145028 A1 | 5/2015 | Laven et al. | |

FOREIGN PATENT DOCUMENTS

| | | |
|---|---|---|
| CN | 101185169 A | 5/2008 |
| CN | 101266948 A | 9/2008 |
| CN | 101375400 A | 2/2009 |
| CN | 102856208 A | 1/2013 |
| DE | 102004057791 A1 | 6/2006 |
| DE | 102006049043 B4 | 3/2011 |
| DE | 102005052734 B4 | 2/2012 |
| EP | 0881692 A2 | 12/1998 |
| EP | 1353385 A1 | 10/2003 |

OTHER PUBLICATIONS

Sumitomo, M et al., "Injection Control Technique for High Speed Switching with a double gate PNM-IGBT", Proceedings of the 25th International Symposium on Power Semiconductor Devices & ICs, Kanazawa, May 2013. pp. 33-36.

Sumitomo, M. et al., "Low loss IGBT with Partially Narrow Mesa Structure (PNM-IGBT)", Proceedings of the 2012 24th International Symposium on Power Semiconductor Devices and ICs, Bruges, Belgium, Jun. 3-7, 2012, pp. 17-20.

\* cited by examiner

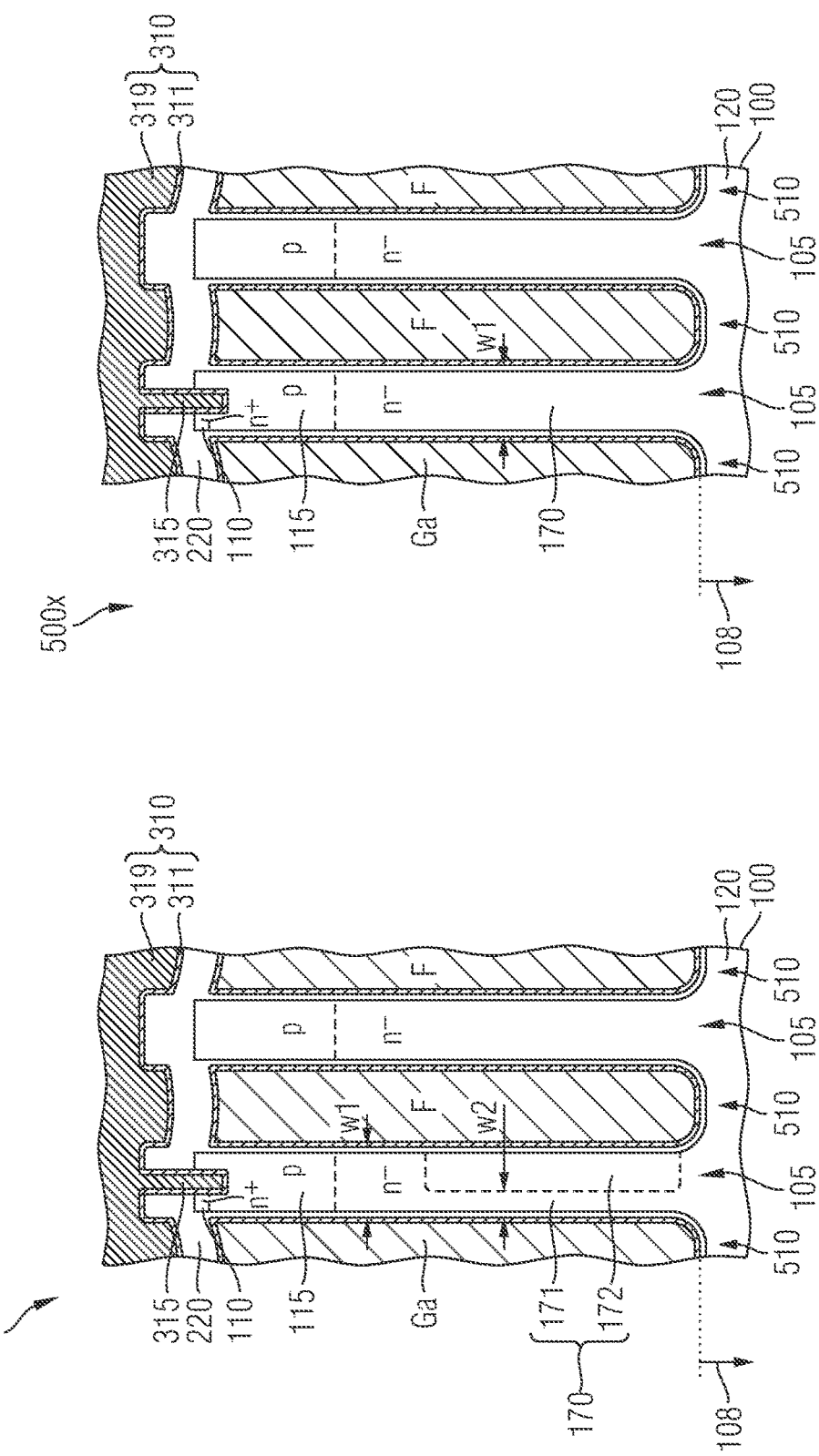

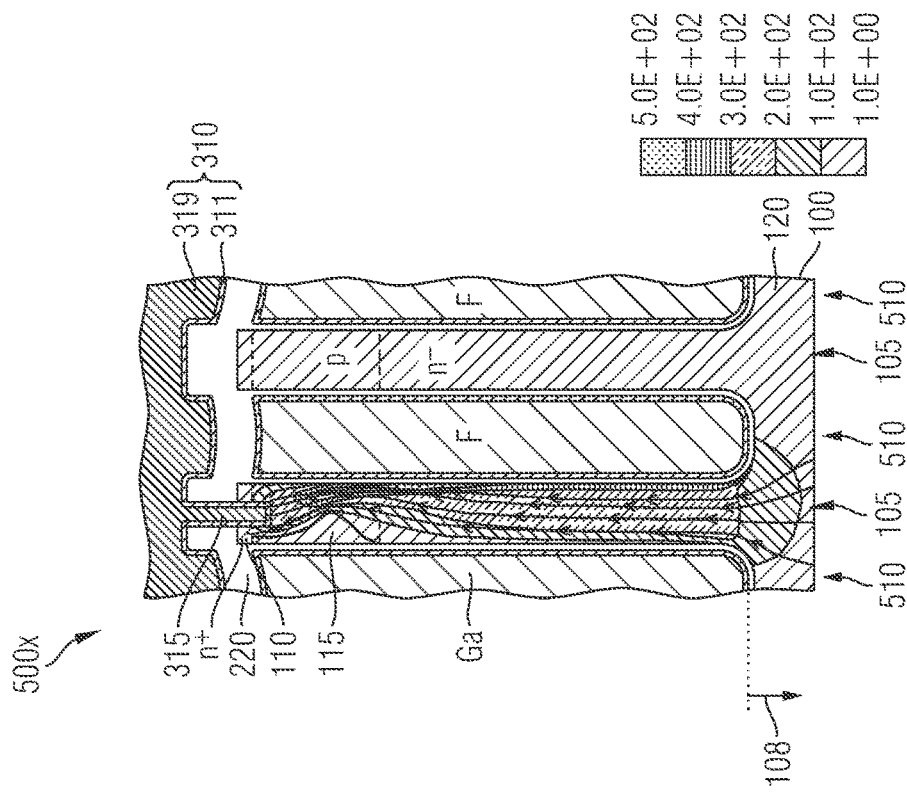
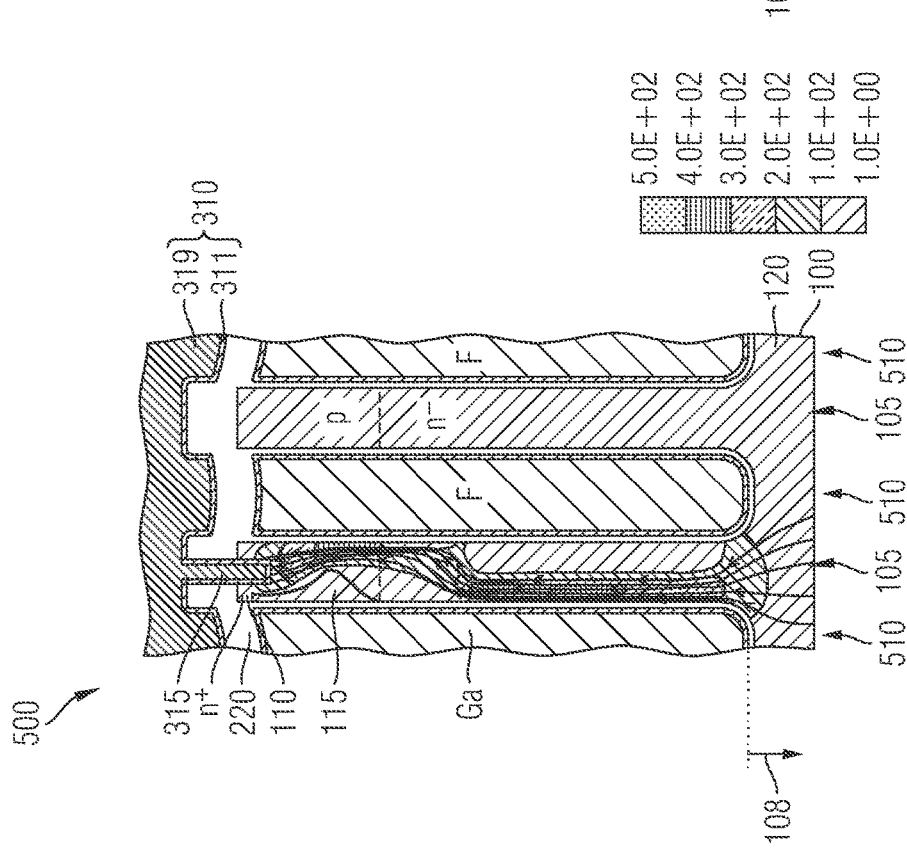

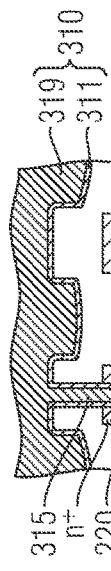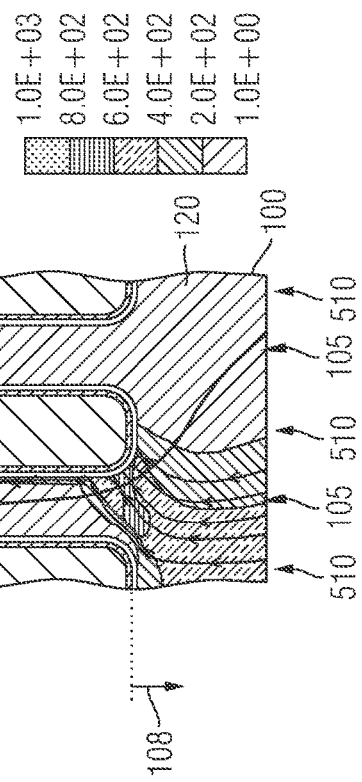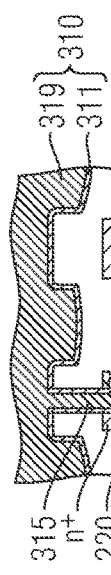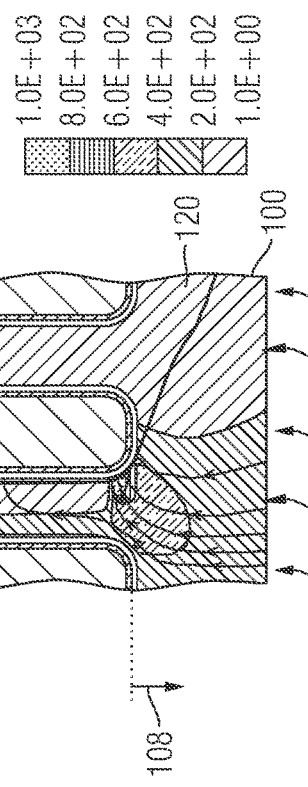
FIG 4A
FIG 4B

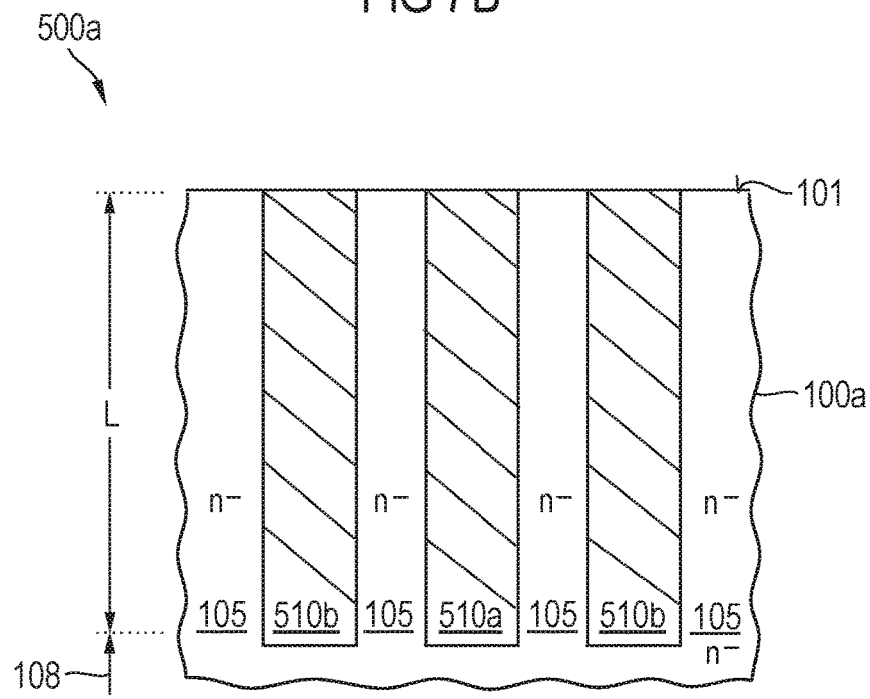
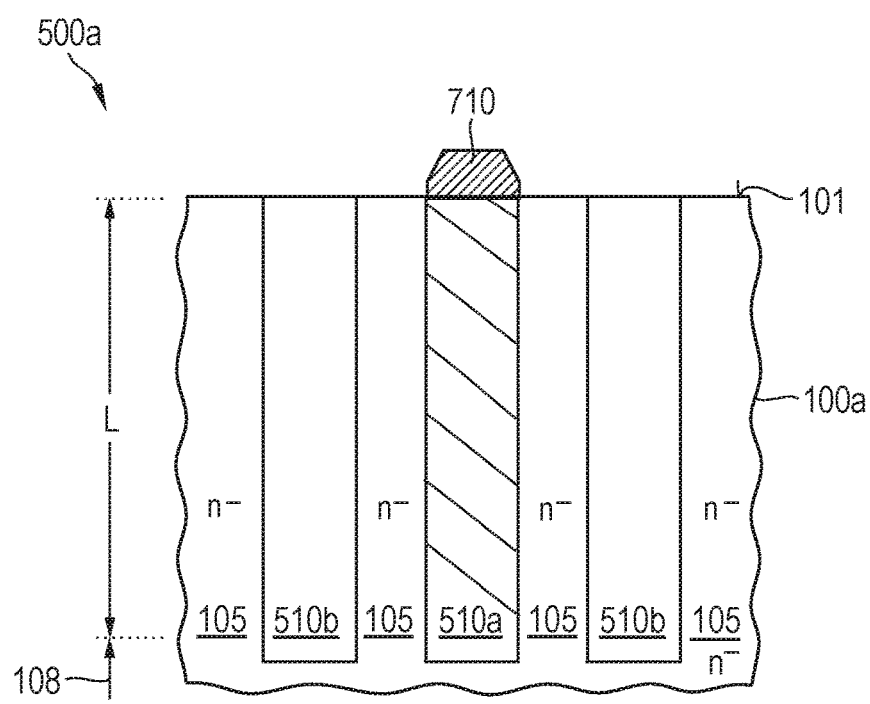

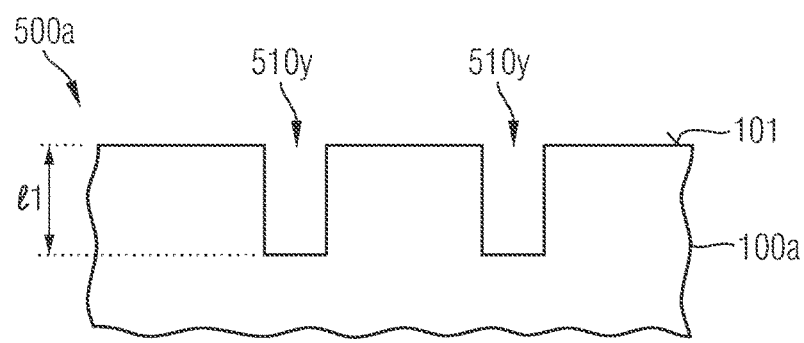
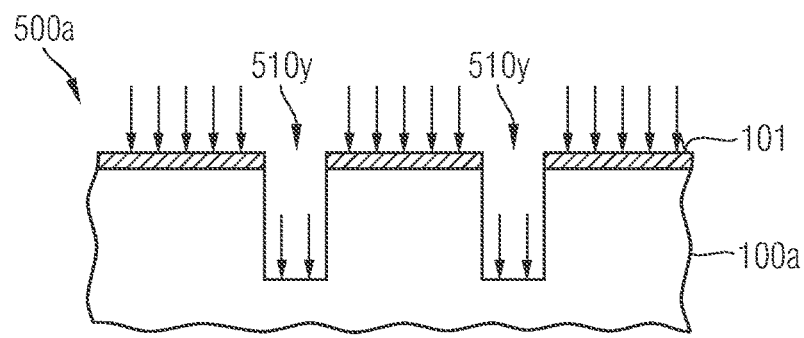
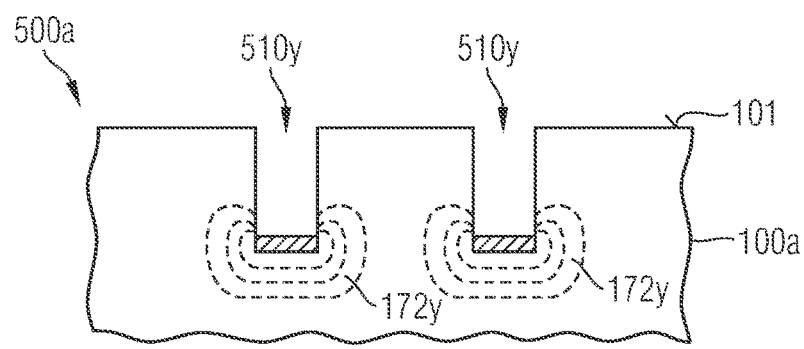
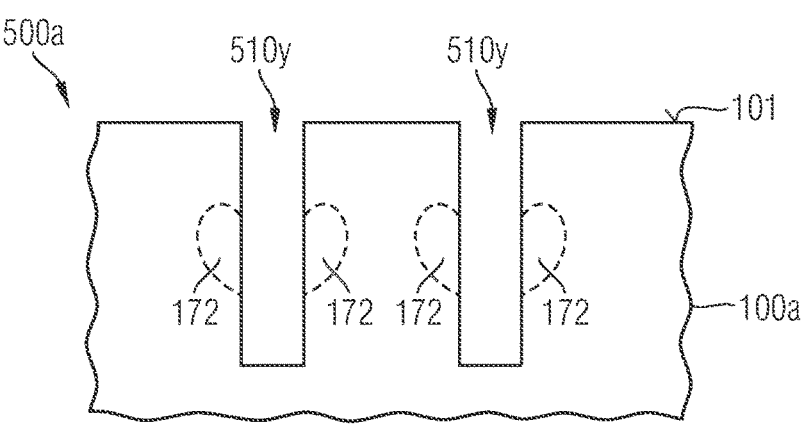

US 9,653,568 B2

METHOD OF MANUFACTURING AN INSULATED GATE BIPOLAR TRANSISTOR WITH MESA SECTIONS BETWEEN CELL TRENCH STRUCTURES

BACKGROUND

IGBTs (insulated gate bipolar transistors) based on vertical IGFET (insulated gate field effect transistor) cells include cell trench structures with buried electrodes and mesa sections of a semiconductor portion between the cell trench structures. A low center-to-center distance (pitch) between neighboring mesa sections increases a total mobile charge carrier supplying capability of the IGFET cells and contributes to a low on-state resistance of the IGBT. It is desirable to provide IGBTs with enhanced device characteristics.

SUMMARY

An embodiment refers to an insulated gate bipolar transistor including a mesa section that extends between two cell trench structures from a first surface of a semiconductor portion to a layer section of the semiconductor portion. A source region, which is electrically connected to an emitter electrode, is formed in the mesa section. A doped region, which is separated from the source region by a body region of a complementary conductivity type, includes a first portion with a first mean net impurity concentration and a second portion with a second mean net impurity concentration exceeding at least ten times the first mean net impurity concentration. In the mesa section the first portion extends from the body region to the layer section.

Another embodiment refers to a method of manufacturing an insulated gate bipolar transistor. Trenches are provided that extend, in a semiconductor portion, from a first surface of the semiconductor portion to a layer section. First impurities are introduced into mesa sections between the trenches to form first and second portions of doped regions in the mesa sections, wherein body regions separate the doped regions from source regions which are electrically connected to an emitter electrode. The second portions of the doped regions have a second mean net impurity concentration exceeding at least ten times a first mean net impurity concentration in first portions of the doped layer. The first portions extend from the body regions to the layer section, respectively.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIG. 2A is a cross-sectional view of a portion of an IGBT according to an embodiment providing gate and field electrodes.

FIG. 2B is a cross-sectional view of an IGBT according to a comparative example for illustrating effects of the embodiments.

FIG. 3A is a schematic diagram showing the hole current density in the cross-sectional plane of FIG. 2A in a normal on-state of the IGBT of FIG. 2A.

FIG. 3B is a schematic diagram showing the hole current density in the cross-sectional plane of FIG. 2B in a normal on-state of the IGBT of FIG. 2B.

FIG. 4A is a schematic diagram showing the hole current density in the cross-sectional plane of FIG. 2A during switch-off of the IGBT of FIG. 2A.

FIG. 4B is a schematic diagram showing the hole current density in the cross-sectional plane of FIG. 2B during switch-off of the IGBT of FIG. 2B.

FIG. 7B is a schematic cross-sectional view of the semiconductor substrate portion of FIG. 7A, after filling the trenches. FIG. 7C is a schematic cross-sectional view of the semiconductor substrate portion of FIG. 7B, after forming an implant mask.

FIG. 8A is a schematic cross-sectional view of a portion of a semiconductor substrate for illustrating a method of manufacturing an IGBT including separated sub-portions of heavily doped second portions of the doped regions after providing provisional trenches.

FIG. 8B is a schematic cross-sectional view of the semiconductor substrate portion of FIG. 8A during an implant.

FIG. 8C is a schematic cross-sectional view of the semiconductor substrate portion of FIG. 8B after a diffusion process providing, from the implant, subsections of heavily doped second portions of doped regions.

FIG. 8D is a schematic cross-sectional view of the semiconductor substrate portion of FIG. 8C after recessing the provisional trenches.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
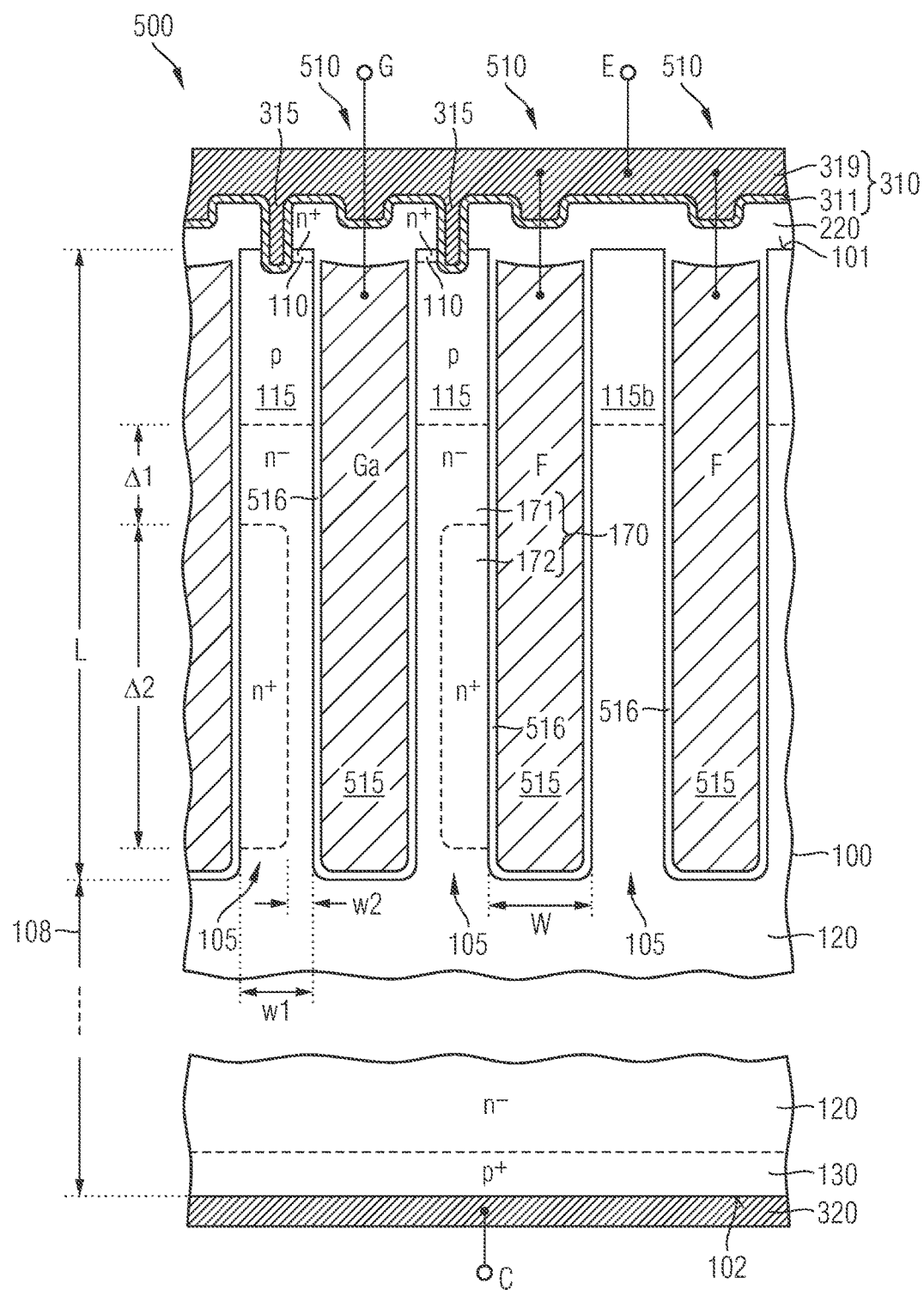
FIG. 1A is a cross-sectional view of a portion of an IGBT according to an embodiment providing source regions and heavily doped second portions of a doped layer on opposite lateral sides of the mesa sections.

FIG. 1A refers to an IGBT 500, which may be a PT-IGBT (punch-trough IGBT), an NPT-IGBT (non-punch-through IGBT), an RB-IGBT (reverse blocking IGBT), or an RC-IGBT (reverse conducting IGBT), by way of example. The IGBT 500 is based on a semiconductor portion 100 provided from a single-crystalline semiconductor material, for example silicon Si, silicon carbide SiC, germanium Ge, a silicon germanium crystal SiGe, gallium nitride GaN or gallium arsenide GaAs. Dimensions and concentrations given in the following refer to silicon IGBTs, by way of example.

A first surface 101 and a second surface 102 of the semiconductor portion 100 are parallel to each other. A minimum distance between the first and second surfaces 101, 102 is selected to achieve a specified voltage blocking capability of a drift layer 120 formed in a layer section 108 of the semiconductor portion 100. For example, the distance between the first and second surfaces 101, 102 may be 90 to 110 μm for an IGBT specified for a blocking voltage of at least 1200 V. Other embodiments related to PT-IGBTs or IGBTs with high blocking capabilities may provide semiconductor portions 100 with a thickness of several 100 μm.

The semiconductor portion 100 may have a rectangular shape with an edge length in the range of several millimeters. The normal to the first and second surfaces 101, 102 defines a vertical direction and directions orthogonal to the normal direction are lateral directions.

Cell trench structures 510 extend from the first surface 101 into the semiconductor portion 100 down to the layer section 108. Between the cell trench structures 510, mesa sections 105 extend from the first surface 101 to the layer section 108. The mesa sections 105 may have vertical sidewalls or sidewalls which are slightly tilted to the first surface 101, wherein the cell trench structures 510 taper with increasing distance to the first surface 101. A vertical extension L of the cell trench structures 510 may be in the range from 1 μm to 20 μm. For example, the vertical extension L of cell trench structures 510 which are not stripe-shaped, e.g., cell trench structures 510 with approximately polygonal cross-sectional areas such as rectangles and squares, may be in the range from 5 μm to 15 μm. The vertical extension L of, e.g., stripe-shaped cell trench structures 510 may be in a range from 2 μm to 7 μm. The lateral width W may be less than 2 μm, e.g. less than 1.2 μm or 600 nm and less.

The cell trench structures 510 include buried electrodes 515 and insulator layers 516 separating the buried electrodes 515 from the semiconductor material outside the cell trench structures 510 and being effective as gate dielectric. The insulator layers 516 may have a uniform thickness in a range from 50 nm to 150 nm, e.g. between 80 nm and 120 nm, by way of example. The buried electrode 515 of at least one of the cell trench structures 510 provides a gate electrode Ga electrically connected or coupled to a gate terminal G of the IGBT 500. Buried electrodes 515 of other cell trench structures 510 may be electrically connected or coupled to the gate terminal G or to an emitter terminal E or to a further terminal. According to another embodiment, all buried gate electrodes 515 are electrically connected or coupled to the gate terminal G.

The cell trench structures 510 may be parallel stripes arranged at a regular pitch in a regular pattern. According to other embodiments, the lateral cross-sectional areas of the cell trench structures 510 may be circles, ellipsoids, ovals or polygons, such as hexagons or rectangles, e.g. squares, with or without rounded corners, or rings. For example, two or three of the first and second cell trench structures 510 may form an arrangement with two or three concentric rings, wherein the rings may be circles, ellipsoids, ovals or rectangles, e.g. squares, with or without rounded corners.

At least one of the mesa sections 105 adjoining a cell trench structure 510 containing a gate electrode Ga includes an IGFET cell with a source region 110 of a first conductivity type, a doped region 170 of the first conductivity type and a body region 115 of a second, complementary conductivity type separating the source region 110 from the doped region 170. The source region 110 may be electrically connected to an emitter electrode 310 and may directly adjoin the first surface 101. The source and body regions 110, 115 form first pn junctions that may run approximately parallel to the first surface 101. The body and doped regions 115, 170 form second pn junctions extending over the whole lateral cross-sectional area of the respective mesa section 105.

The layer section 108 of the semiconductor portion 100 includes the drift layer 120 and a collector layer 130 that directly adjoins the second surface 102. The collector layer 130 may be a continuous layer of the second conductivity type. According to other embodiments, for example embodiments related to RC-IGBTs, the collector layer 130 may include first portions of the first conductivity type and second portions of the second conductivity type, wherein the first and second portions alternate along one lateral direction or in both lateral directions. A mean net impurity concentration in the collector layer 130 may be at least $1 \times 10^{16}$ cm$^{-3}$, for example at least $5 \times 10^{17}$ cm$^{-3}$.

A dielectric capping layer 220 may dielectrically insulate some of the cell trench structures 510 and some of the mesa sections 105 from the emitter electrode 310 disposed at a side of the semiconductor portion defined by the first surface 101. Contact structures 315 extend through openings in the dielectric capping layer 220 and electrically connect the emitter electrode 310 with the source regions 110 and such body regions 115 that adjoin the source regions 110. The body regions 115 may include heavily doped contact regions of the second conductivity type along the interface with the contact structures 315 to reduce the contact resistance.

The emitter electrode 310 is electrically connected to the emitter terminal E and may include at least one barrier layer 311 having a uniform thickness in the range of 5 nm to 100 nm and consisting of or containing a layer of titanium nitride TiN, tantalum nitride TaN, titanium Ti or tantalum Ta, by way of example. A main layer 319 of the emitter electrode 310 may consist of or contain tungsten W or tungsten-based metals, heavily doped polysilicon, carbon C, aluminum Al, copper Cu, or alloys of aluminum and copper, for example AlCu or AlSiCu.

A collector electrode 320 directly adjoins the second surface 102. The collector electrode 320 is electrically connected to the collector layer 130 and may consist of or contain, as main constituent(s) aluminum Al, copper Cu, or alloys of aluminum or copper, for example AlSi, AlCu or AlSiCu. According to other embodiments, the collector electrode 320 may contain one, two, three or more sub-layers, wherein each sub-layer contains, as main constituent(s), at least one of nickel Ni, titanium Ti, silver Ag, gold Au, tungsten W, platinum Pt and/or palladium Pd. For example, a sub-layer may contain a metal silicide, a metal nitride, or a metal alloy containing Ni, Ti, Ag, Au, W, Pt, and/or Pd. The collector electrode 320 is electrically connected or coupled to a collector terminal C of the IGBT 500.

The doped region 170 includes a first portion 171 with a first mean net impurity concentration and a second portion 172 with a second mean net impurity concentration exceeding at least ten times, for example at least 100 times, the first mean net impurity concentration. The first portion 171 extends from the body region 115 to the drift layer 120 in the layer section 108. The first portion 171 forms a contiguous path of approximately the same impurity concentration between the body region 115 and the drift layer 120.

The second portion 172 may be a one-part structure directly adjoining one of the adjacent cell trench structures 510 or may be a multi-part structure with two or more sub-portions spatially separated by the first portion 171. The second mean net impurity concentration may be at least thousand times the first mean net impurity concentration. For example, the mean net impurity concentration in the first portion 171 and the drift layer 120 may be between $1 \times 10^{12}$ cm$^{-3}$ and $5 \times 10^{14}$ cm$^{-3}$, e.g., between $5 \times 10^{12}$ cm$^{-3}$ and $1 \times 10^{14}$ cm$^{-3}$ and the second mean net impurity concentration may be at least $1 \times 10^{16}$ cm$^{-3}$. Within each portion 171, 172, the net impurity concentration may be constant, strictly decreasing, or strictly increasing. Points of inflection in the lateral impurity concentration profile may separate the first and second portions 171, 172 from each other.

According to an embodiment, the second portions 172 of the doped regions 170 contain deep donors with an ionization energy greater than, e.g., 100 meV or deep double donors, e.g., sulfur S or selenium Se. With S, Se impurities, the electric efficiency of the second portions 172 increases with increasing temperature providing a further degree of freedom for trimming the temperature behavior of the IGBT 500.

A lateral width w2 of the first portions 171 separating the second portions 172 from the cell trench structures 510 including the gate electrodes Ga may be at most a half of a total mesa width w1. For example, for active mesa sections 105 directly adjoining the cell trench structures 510 with the gate electrodes Ga and having a mesa width w1 of 600 nm, the first portions 171 may have a second width w2 of about 230 nm.

A lateral impurity density profile of the mesa section 105 parallel to the first surface 101 has at least one minimum value and at least one maximum value exceeding the minimum value by a factor 100 or greater.

Figure 1B:
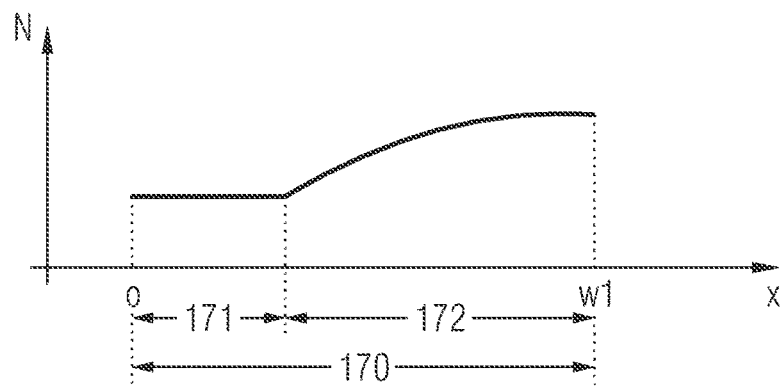
FIG. 1B is a schematic diagram of an impurity concentration profile along a lateral cross-sectional plane of a mesa section of an n-channel IGBT in accordance with an embodiment providing the second portions by introducing n-type impurities through a sidewall of the mesa section.
Figure 1C:
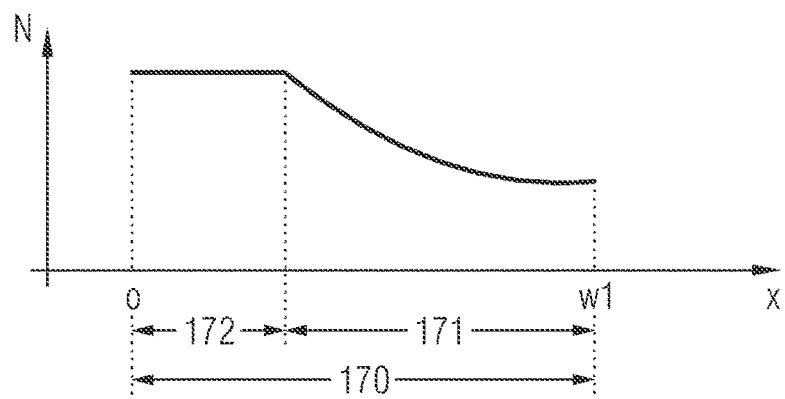
FIG. 1C is a schematic diagram of an impurity concentration profile along a lateral cross-sectional plane of a mesa section of an n-channel IGBT in accordance with an embodiment providing the first portions by introducing p-type impurities through a sidewall of the mesa section.

The lateral impurity concentration profile of a doped region 170 as illustrated in FIG. 1B may result from locally introducing impurities of the first conductivity type into a mesa section 105 having a homogenous background impurity concentration corresponding to that of the first portion 171. The second portion 172 is formed by a diffusion process effective on the introduced impurities. In the first portion 171 the mean net impurity concentration is constant along the lateral direction and in the second portion 172 the impurity concentration decreases from a maximum value at the interface to the neighboring cell trench structure 510 to the value given by the background impurity concentration.

The lateral impurity profile of FIG. 10 results from counter-doping a mesa section with a high background impurity concentration of the first conductivity type by introducing impurities of the second conductivity type. The first portion 171 is formed by a diffusion process applied to the introduced second conductivity type impurities and the second portion 172 is formed by a portion of the mesa section 105, which remains unaffected by the introduced impurities.

Figure 1D:
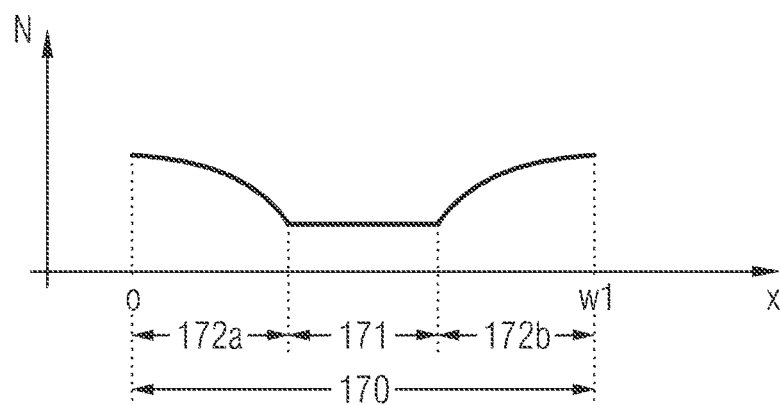
FIG. 1D is a schematic diagram of an impurity concentration profile along a lateral cross-sectional plane of a mesa section of an n-channel IGBT in accordance with an embodiment providing separated sub-portions of the second portion by introducing n-type impurities through sidewalls of the mesa section.

The lateral impurity profile of FIG. 1D results from introducing impurities of the first conductivity type from both sides of the mesa section 105 to form a second portion 172 including a first and a second sub-portion 172a, 172b spatially separated by a first portion 171, which has a uniform impurity concentration given by the background impurity concentration.

The heavily doped second portions 172 virtually narrow the mesa sections 105 during normal on-state operation of the IGBT 500. The effects of the virtually narrowed mesa section 105 are discussed on the basis of the n-channel IGBT 500 of FIG. 1A with the first conductivity type of the source and doped regions 110, 170 being the n type and the second conductivity type of the body regions 115 being the p type. Equivalent considerations apply to p-channel IGBTs with the first conductivity type being the p type and the second conductivity type being the n type.

During normal on-state operation of the IGBT 500 a charge carrier plasma in the drift layer 120 contains holes and electrons, wherein the denser the charge carrier plasma is the more conductive is the drift layer and the lower are the static losses in the normal on-state. The high concentration of stationary positive ions of the impurity atoms in the heavily doped second portions 172 bar holes from being drained off from the drift layer 120 through the second portions 172 and the body regions 115. The charge carrier plasma in the drift layer 120 remains denser than without the second portion 172 and as a consequence the drift layer 120 is more conductive. Static, ohmic losses occurring in the normal on-state are reduced.

Other than approaches aiming at stabilizing the charge carrier plasma by widening bottom portions of the cell trench structures 510, the lateral mesa width w1 of the mesa sections 105 can be kept comparatively wide over the whole vertical extension L for achieving the same degree of improvement as regards the static losses. Conventional approaches relying on narrowing the width of the mesa sections 105 typically include critical processes leading to a low reproducibility of the design over the wafer diameter and among the wafers of a wafer lot. For example, thin and high mesa sections 105 are subject to processes that may let collapse some mesa sections 105 before the spaces between the mesa sections 105 are filled with the material of the buried electrodes 515.

A virtual narrowing of the mesa sections 105 with the heavily doped portions 172 achieves a similar effect without critical processes.

According to an embodiment, the source regions 110 directly adjoin a first one of the two neighboring cell trench structures 510 at a first lateral side of the respective mesa section 105 and the body regions 115 separate the source regions 110 from a second one of the cell trench structures 510 at a second lateral side of the mesa section 105, respectively, in order to keep a maximum short-circuit current through the IGBT 500 sufficiently small.

The electric efficiency of the second portion 172 is the higher, the smaller a distance Δ1 between the body regions 115 and the second portion 172 is. The distance Δ1 may be at most half of the vertical extension L of the mesa section 105. According to embodiments with the source region 110 directly adjoining a first neighboring cell trench structure 510 at a first lateral side of the mesa section 105 and separated from the second neighboring cell trench structures 510, the first portion 171 separates the second portion 172 from the first cell trench structures 510 and the second portion 172 may directly adjoin the body region 115. In this case, processes for forming the second portion 172 do not influence the impurity concentrations at the pn junction between the body region 115 and the first portion 171 of the doped region 170 along the first lateral side where a conductive inversion channel is formed in the normal on-state of the IGBT 500 along the first cell trench structures 510 including the gate electrode Ga and where the impurity concentration determines a local threshold voltage of the IGFET cell.

A vertical extension Δ2 of the second portion 172 may be at most half of the vertical extension L of the mesa sections 105. With a small vertical extension Δ2 the second portion 172 is less effective as a field stop such that a small vertical extension Δ2 avoids a degradation of the blocking capability of the IGBT 500.

FIG. 1A refers to an embodiment with the buried electrodes 515 of some of the cell trench structures 510 forming field electrodes F, which may be electrically connected to the emitter electrode 310 and the emitter terminal E. Ancillary mesa sections 105 between cell trench structures 510 with field electrodes F may include secondary doped portions and secondary body regions 115b separating the secondary doped regions from the first surface 101. The secondary doped regions may include weakly and heavily doped portions corresponding to the first and second portions 171, 172. The capping dielectric layer 220 may or may not dielectrically insulate the emitter electrode 310 from the field electrodes F.

Figure 1E:
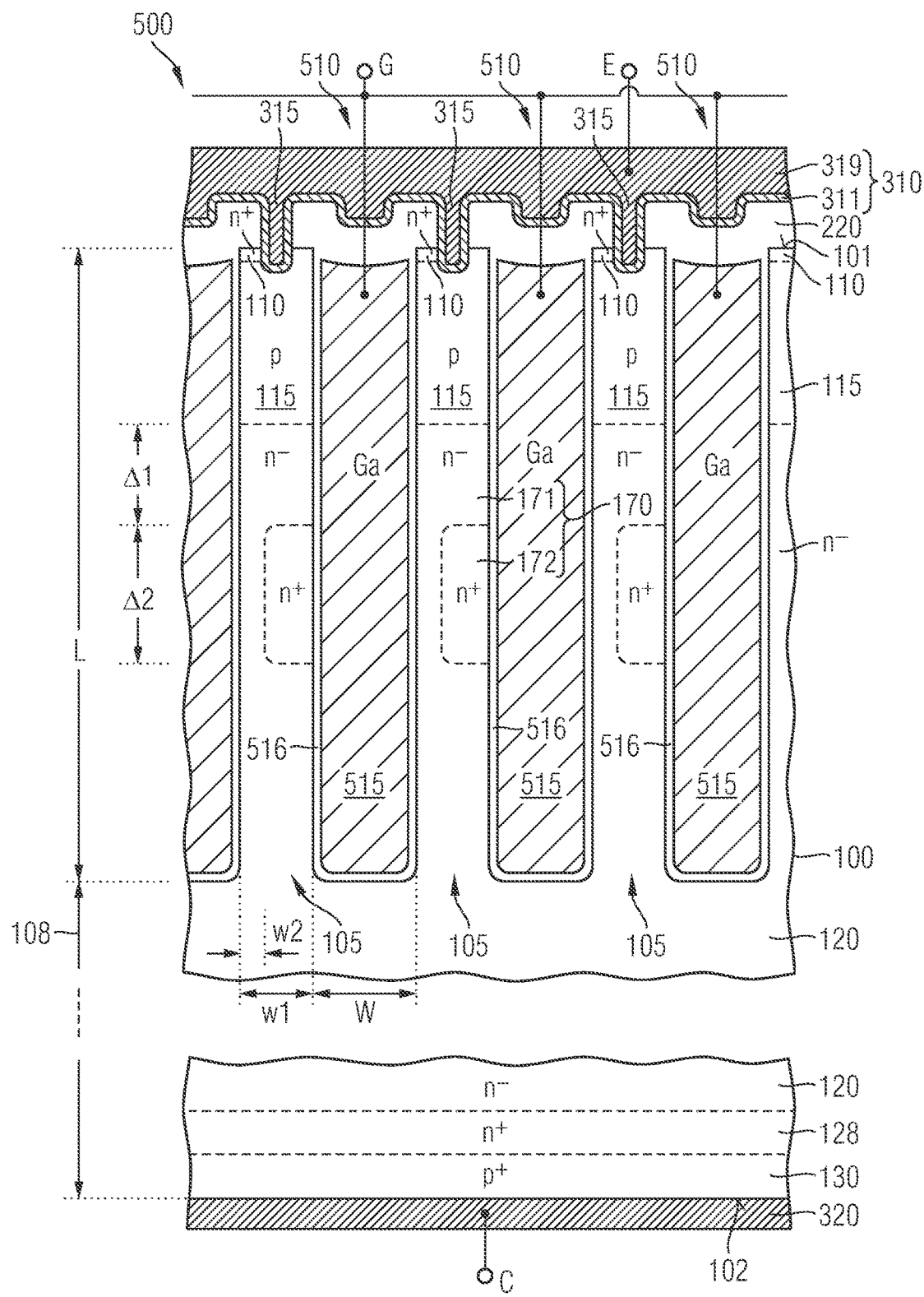
FIG. 1E is a schematic cross-sectional view of a portion of an IGBT according to an embodiment providing mesa sections between cell trench structures with gate electrodes.

FIG. 1E refers to an embodiment without field electrodes F. The source regions 110 may be formed at a first lateral side of the mesa sections 105 and the second portions 172 along the second lateral side opposite to the first lateral side, respectively.

The semiconductor portion 100 may further include a field stop or buffer layer 128 between the collector layer 130 and the drift layer 120. A mean net impurity concentration in the field stop/buffer layer 128 may be between $5 \times 10^{15}$ cm$^{-3}$ and $1 \times 10^{18}$ cm$^{-3}$, for example in a range from $1 \times 10^{15}$ cm$^{-3}$ to $5 \times 10^{16}$ cm$^{-3}$ and may exceed at least five times the mean net impurity concentration in the drift layer 120.

According to an embodiment, the field stop/buffer layer 128 may have an inhomogeneous doping in a vertical direction exhibiting one or more local maxima and/or one or more local minima. At the local maxima, the peak doping may excess a mean net impurity concentration in the field stop/buffer region 128 up to a factor of 100, while the local minima may exhibit an impurity concentration down to the impurity concentration in the drift layer 120.

Figure 1F:
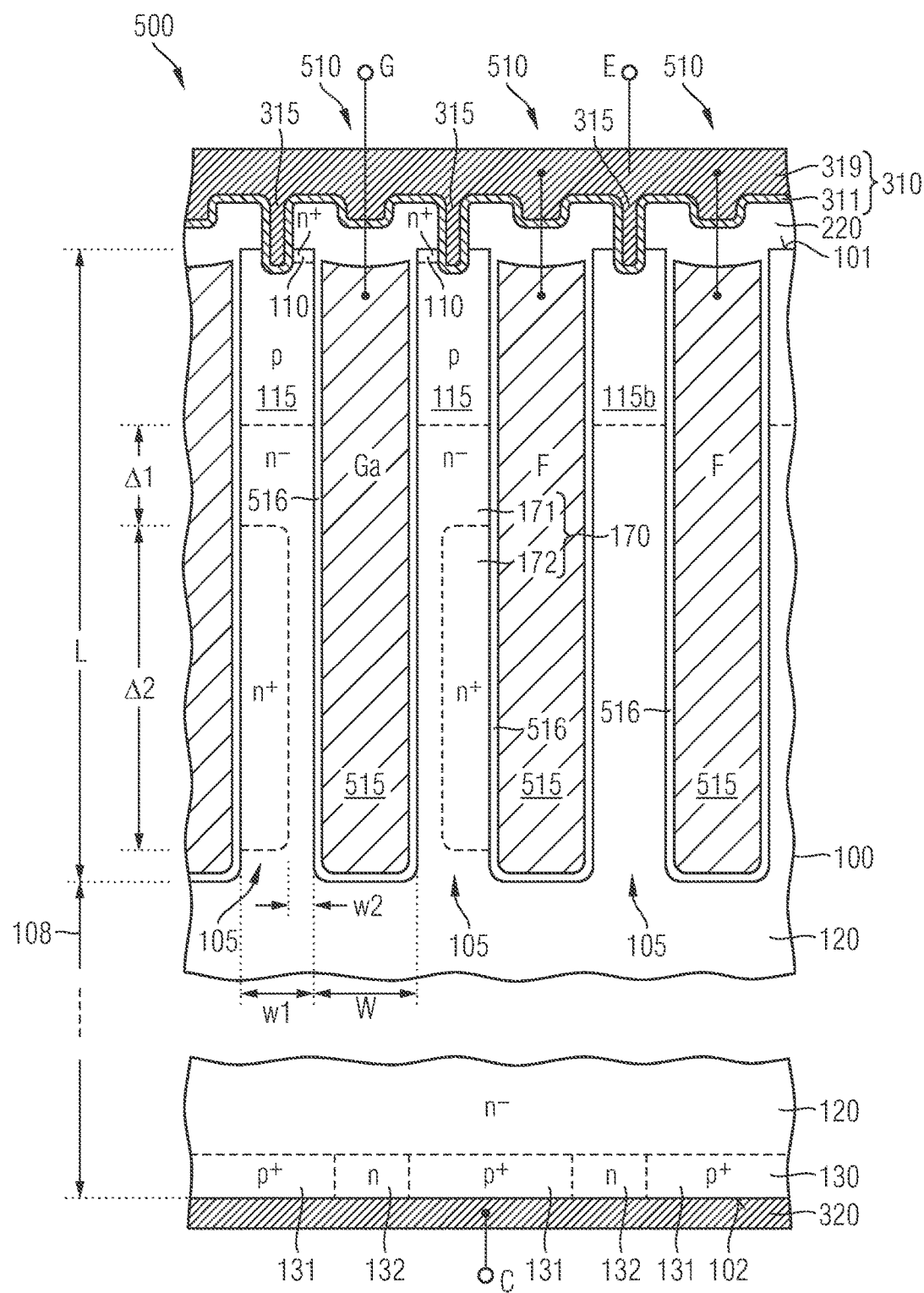
FIG. 1F is a schematic cross-sectional view of a portion of an IGBT according to an embodiment related to an RC-IGBT.

FIG. 1F refers to an RC-IGBT with the collector layer 130 including first portions 131 of the second conductivity type and second portions 132 of the first conductivity type The first and second portions 131, 132 alternate along one lateral direction or along both lateral directions. Additional contact structures 315 electrically connect the emitter electrode 310 with some or all of the secondary body regions 315b. The secondary body regions 115b form anode regions and the second portions 132 of the collector layer 130 form cathode regions of an integrated free-wheeling diode which is effective between the emitter electrode 310 and the collector electrode 320.

Figure 1G:
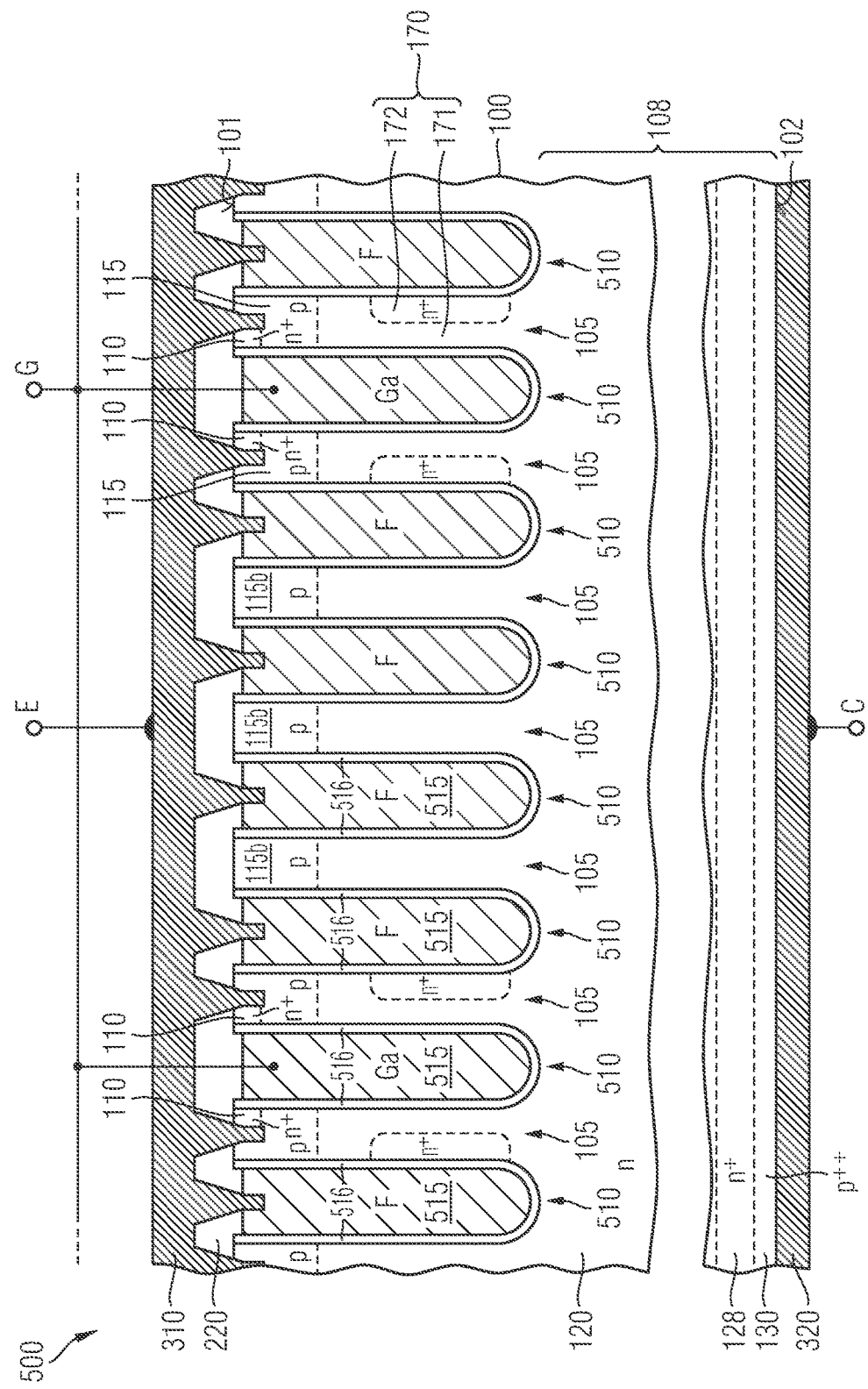
FIG. 1G is a schematic cross-sectional view of a portion of an IGBT according to an embodiment providing four field electrodes per gate electrode.

The IGBT 500 of FIG. 1G includes four field electrodes F between a pair of gate electrodes Ga. The emitter electrode 310 is electrically connected to the field electrodes F and the source and body regions 110, 115 in active mesa sections 105 on both sides of each gate electrode Ga.

FIG. 2A shows a schematic cross-sectional view of an IGBT 500 including gate and field electrodes Ga, F in cell trench structures 510. A doped region 170 of a mesa section 105 between a body region 115 and a layer section 108 includes a heavily doped second portion 172 separated from a cell trench structure 510 including a gate electrode Ga as well as a source region 110 directly adjoining the cell trench structure 510 including the gate electrode Ga. A lateral mesa width w1 of the mesa section 105 is about 600 nm and a lateral width w2 of a first portion 171 separating the second portion 172 from the cell trench structure 510 including the gate electrode Ga is about 230 nm.

FIG. 2B shows an equivalent cross-sectional view of a conventional IGBT 500x without second portions 172 in mesa sections 105 having the same lateral mesa width w1 as the IGBT 500 of FIG. 2A.

FIG. 3A shows a hole current density in the mesa sections 105 during a normal on-state of the IGBT 500 of FIG. 2A. No holes cross the second portions 172. The second portions 172 effectively reduce the total amount of holes drained off from the drift layer 120 to the contact structure 315 through the body region 115 in the normal on-state. Compared to the hole current in the normal on-state of the reference IGBT 500x as illustrated in FIG. 3B, the heavily doped second portion 172 effectively reduces the total amount of holes drained off from the drift layer 120 to the emitter electrode 320 through the body region 115.

FIGS. 4A and 4B show the hole current density during switch-off at a collector-emitter voltage $V_{CE}$ of 20 V for the IGBTs 500, 500x of FIGS. 2A and 2B. A fast carrier removal during switch-off reduces dynamic switching losses. At least for a $V_{CE}$ greater 20 V the second portion 172 does not block a carrier removal from the drift layer 120 during switch-off. At least starting from a threshold level of $V_{CE}$ the second portion 172 does not or only to a low degree adversely affect the hole current density during switch-off and hence the dynamic switching losses.

In other words, in the normal on-state an IGBT 500 with virtually narrowed mesa sections 105 having a mesa width w1 of 600 nm behaves like a conventional IGBT with mesa sections having a mesa width w1 of 300 nm, whereas during switch-off the IGBT 500 of FIG. 2A shows rather the behavior of the conventional IGBT 500x of FIG. 2B with a mesa width w1 of 600 nm.

Figure 5:
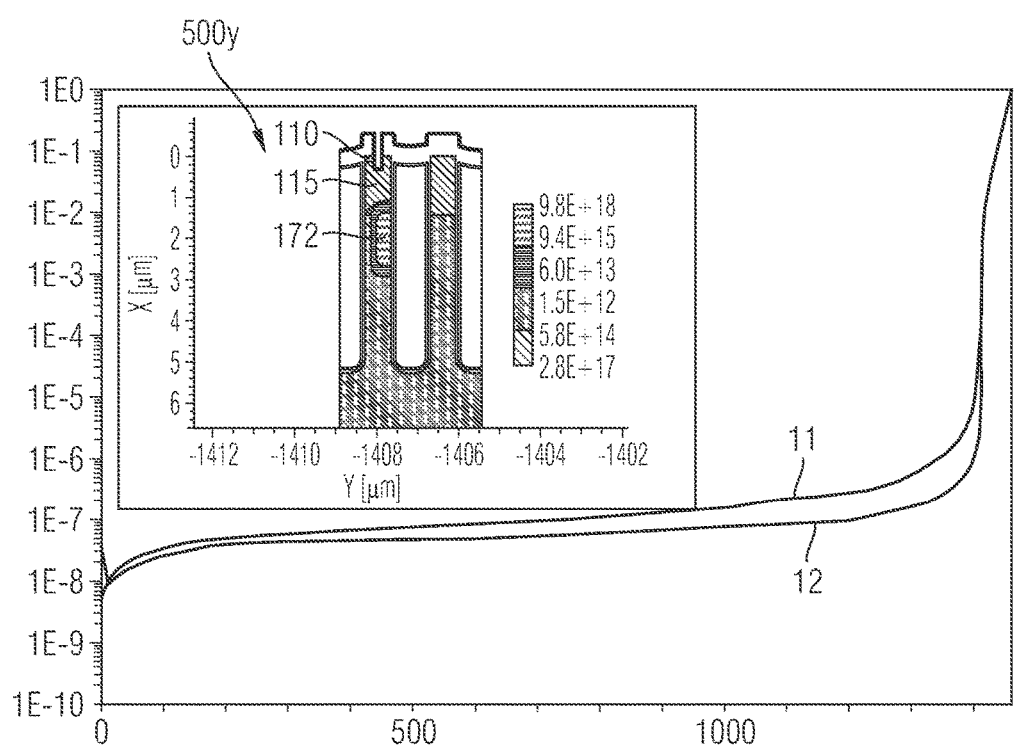
FIG. 5 is a schematic diagram illustrating the breakdown characteristics of IGBTs according to an embodiment and a comparative example.

FIG. 5 plots the breakdown characteristic 11 for the illustrated IGBT 500y including virtually narrowed mesa sections, and the breakdown characteristic 12 of a conventional reference device with the mesa sections not virtually narrowed. While the leakage current is slightly increased by a factor of at most 2, the breakdown voltage is approximately the same. The virtually narrowed mesa sections improve the on-state characteristics without adversely affecting the breakdown capability.

Figure 6A:
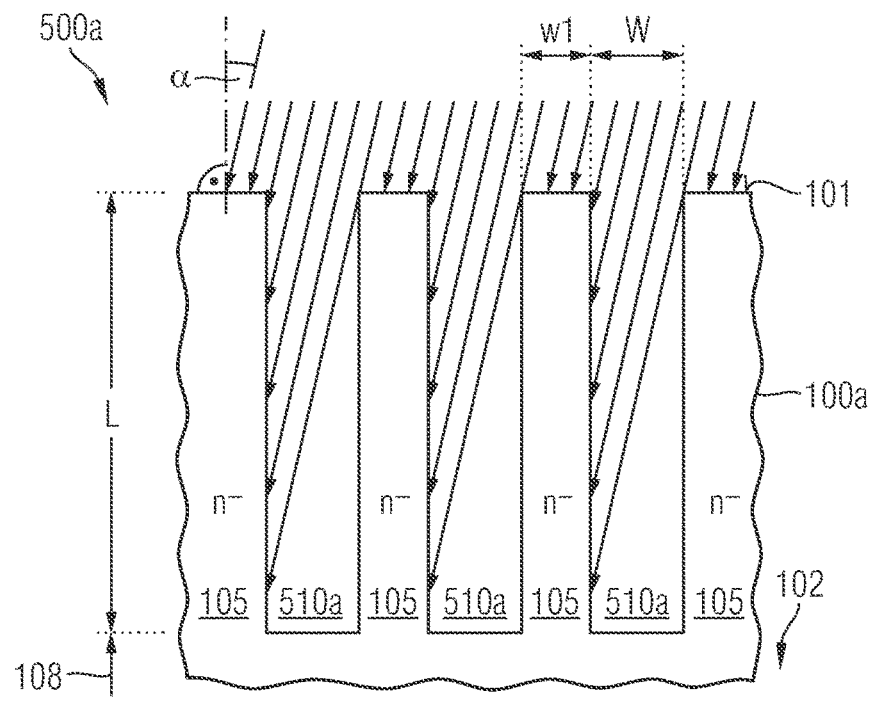
FIG. 6A is a schematic cross-sectional view of a portion of a semiconductor substrate for illustrating a method of manufacturing an IGBT with single-sided heavily doped second portions in the doped regions during a tilted implant.
Figure 6B:
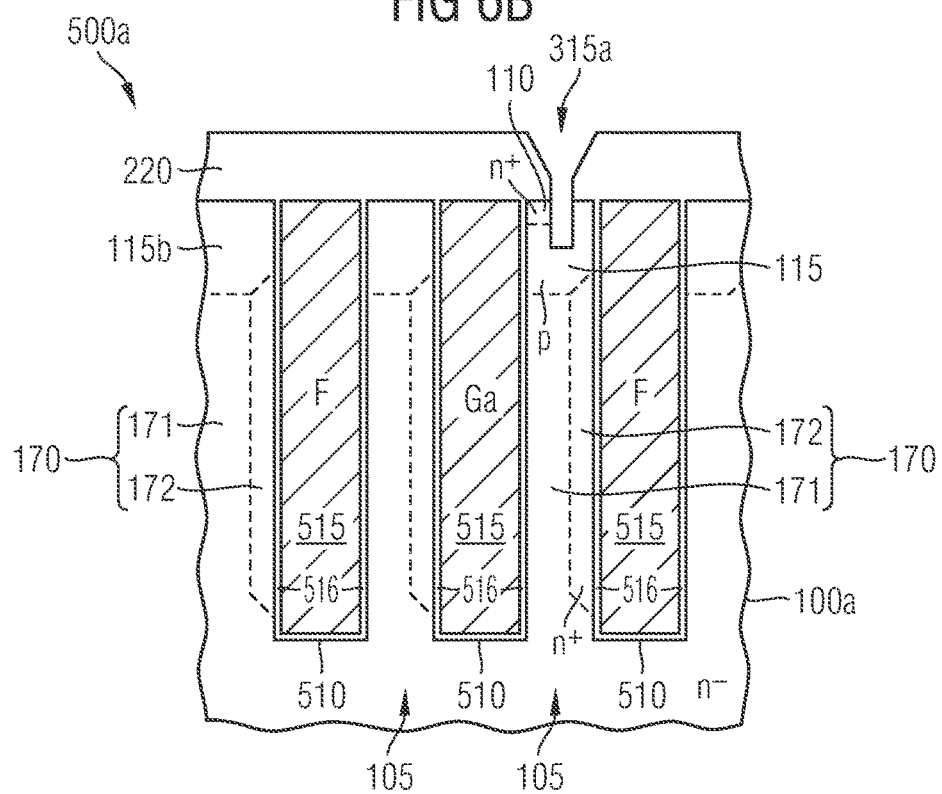
FIG. 6B is a schematic cross-sectional view of the semiconductor substrate portion of FIG. 6A after providing contact grooves according to an embodiment providing cell trench structures with field electrodes between cell trench structures with gate electrodes.
Figure 6C:
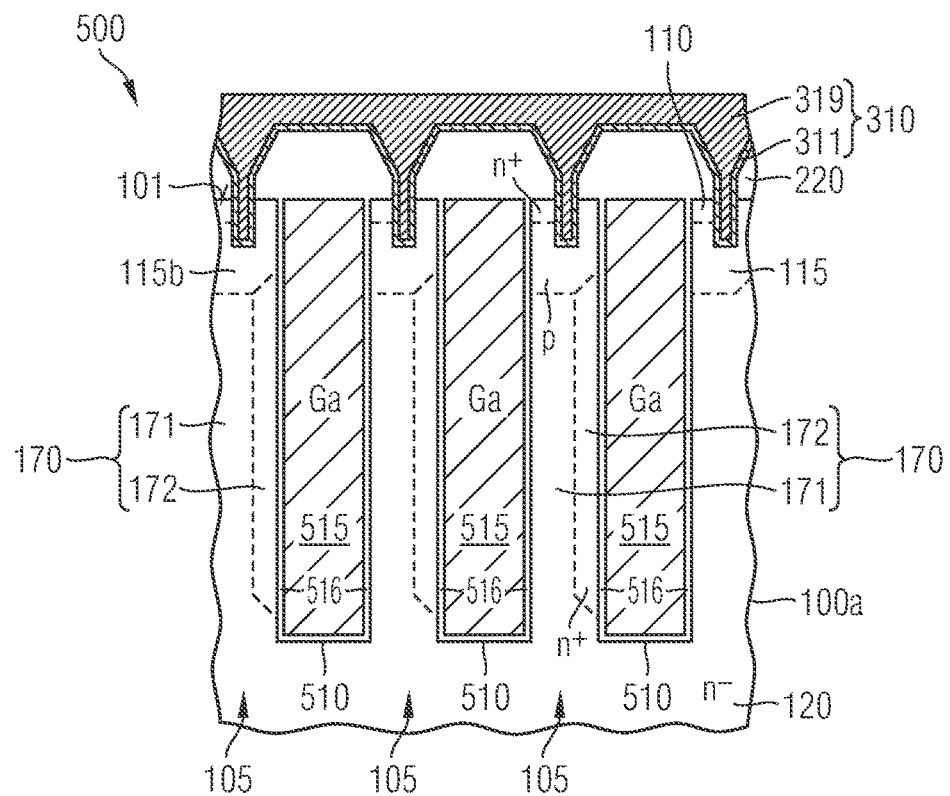
FIG. 6C is a schematic cross-sectional view of a portion of an IGBT without field electrodes and manufactured according to the method of FIG. 6A.

FIGS. 6A to 6C refer to a method of manufacturing an IGBT with virtually narrowed mesa sections based on a semiconductor substrate 500a consisting of or containing a semiconductor layer 100a of a single-crystalline semiconductor material. The single-crystalline semiconductor material may be silicon Si, silicon carbide SiC, germanium Ge, a silicon germanium crystal SiGe, gallium nitride GaN or gallium arsenide GaAs. For example, the semiconductor substrate 500a may be a silicon wafer from which a plurality of identical semiconductor dies is obtained. The semiconductor layer 100a has a planar first surface 101 and a second surface 102 parallel to the first surface 101.

Trenches 510a are etched from the first surface 101 into the semiconductor layer 100a down to a layer section 108. The trenches 510a may have vertical sidewalls or sidewalls which are slightly tilted to the first surface 101, wherein the trenches 510a taper with increasing distance to the first surface 101. The vertical extension L of the trenches 510a may be in the range from 2 µm to 7 µm. A lateral width W of the trenches 510a may be less than 2 µm, e.g. less than 1.2 µm. A lateral mesa width w1 of mesa sections 105 between the trenches 510a may be less than 1 µm, e.g. at most 600 nm.

The trenches 510a may be parallel stripes arranged at the same pitch in a regular pattern. According to other embodiments, the lateral cross-sectional areas of the trenches 510a may be circles, ellipsoids, ovals or polygons such as hexagons or rectangles, e.g. squares, with or without rounded corners or rings. For example two or three of the trenches 510a may form an arrangement with two or three concentric rings, wherein the rings may be circles, ellipsoids, ovals or rectangles, e.g. squares, with or without rounded corners. The trenches 510a may have the same depth. According to other embodiments, two types of trenches 510a may be provided with different vertical extensions.

The mesa sections 105 may contain impurities of a background impurity type at a background impurity concentration. For example, the mesa sections 105 may result from a layer grown by epitaxy and in-situ doped at the background impurity concentration. The background impurity type may be the n-type and the background impurity concentration may be a low concentration of at most $5 \times 10^{14}$ cm$^{-3}$, for example at most $5 \times 10^{12}$ cm$^{-3}$, by way of example.

Impurities may be selectively introduced in second sidewalls of the mesa sections 105, wherein the second sidewalls are oriented to a second lateral side, respectively. No or only few impurities are introduced into the layer section 108 through the bottom of the trenches 510a and no or only few impurities are introduced into first sidewalls of the mesa sections 105 at a first lateral side opposite to the second lateral side.

According to an embodiment illustrated in FIG. 6A impurities of the first conductivity type may be implanted by a tilted implant at an implant angle α equal to or greater than tan (W/L), wherein the implant angle α is defined with reference to the vertical direction normal to the first surface 101. The mesa sections 105 shadow the trench bottoms and the first sidewalls during the implant.

Alternatively, the impurities are introduced using a plasma deposition in combination with a drive-in step to provide a vertically homogenous impurity distribution. Before the drive-in step, implanted regions at the bottom of the trenches 510a or at the first sidewalls may be removed. Alternatively, an impurity mask covering the trench bottom and/or the first sidewalls and exposing the second sidewalls may be provided before the plasma deposition.

According to a further embodiment the plasma deposition is controlled such that in the trenches 510a the impurity source depletes with increasing distance to the first surface 101 and depletes completely above the trench bottom. As a result the impurity concentration in the second portions 172 decreases with increasing distance to the first surface 101. Instead of plasma deposition other embodiments may rely on out diffusion from a heavily doped sacrificial layer of, e.g. polycrystalline silicon.

An insulator layer may be provided by deposition or thermal growth. The insulator layer lines the trenches 510a. The material of the insulator layer may be a semiconductor oxide or nitride, for example a silicon oxide, a silicon oxynitride or a silicon nitride. Heavily doped polycrystalline material may be deposited that fills the trenches 510a lined with the insulator layer. Portions of the deposited material in the trenches 510a form buried electrodes 515 providing gate electrodes Ga and field electrodes F.

P type impurities may be introduced through the first surface 101 into the mesa sections 105, wherein the p type impurities counter-dope the impurities implanted by the tilted implant in an upper portion of the mesa sections 105 oriented to the first surface 101. N type impurities may be introduced using an impurity mask in portions of the mesa sections 105 directly adjoining some of the filled trenches 510a with gate electrodes Ga. A dielectric capping layer 220a may be deposited and contact openings 315a may be etched through the dielectric capping layer 220a at least into such mesa sections 105 that include source regions 110.

FIG. 6B shows cell trench structures 510 emerging from the trenches 510a of FIG. 6A, wherein some of the cell trench structures 510 include gate electrodes Ga and other cell trench structures 510 include field electrodes F electrically separated from the gate electrode Ga. The source regions 110 are formed at the first lateral sides. Heavily doped second portions 172 of the doped region 170 are formed on the second lateral sides of both active mesa sections 105 with source regions 110 and inactive ancillary mesa sections 105 without source regions 110. Secondary doped regions 170b in the inactive ancillary mesa sections 105 may also include weakly doped first portions 171 and heavily doped second portions 172.

FIG. 6C refers to an IGBT 500 without field electrodes and manufactured, e.g., according to the method of FIGS. 6A and 6B. Each cell trench structure 510 includes a gate electrode Ga and each mesa section 105 is an active mesa section including a source region 110 formed along the first lateral side and a doped region 170 with a heavily doped second portion 172 spaced from the first lateral side and formed along a second lateral side. Since the source regions 110 and second portions 172 are formed on opposing sides, fluctuations in the impurity concentration of the second portions 172 do not affect the local threshold voltage, which is defined by the pn junction between the body region 115 and the doped region 170 along the first lateral side in the respective mesa section 105.

Figure 7A:
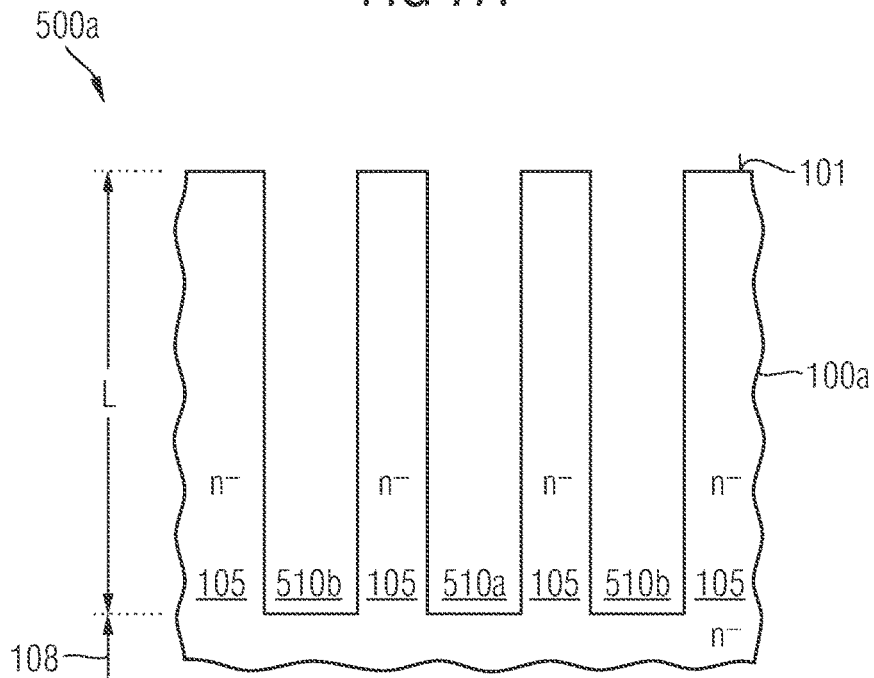
FIG. 7A is a schematic cross-sectional view of a portion of a semiconductor substrate for illustrating a method of manufacturing an IGBT with symmetric source regions, after forming trenches.

FIGS. 7A to 7G refer to embodiments with active mesa sections 105 arranged mirror-inverted to a common cell trench structure 510 including a gate electrode Ga. FIG. 7A shows that trenches 510a are formed in a semiconductor layer 100a as described with reference to FIG. 6A. A mask layer, e.g. a HDP oxide, amorphous silicon, polysilicon or carbon, may be deposited that covers the first surface 101 and openings of the trenches 510a, 510b with or without filling the trenches 510a, 510b. The mask layer may be patterned by a photolithographic process to provide an implant mask 710 covering the openings of the first trenches 510a provided for the formation of gate electrodes and exposing openings of second trenches 510b provided for the formation of field electrodes. A first implant is performed at a first implant angle α equal to or greater than arctan (W/L).

Figure 7D:
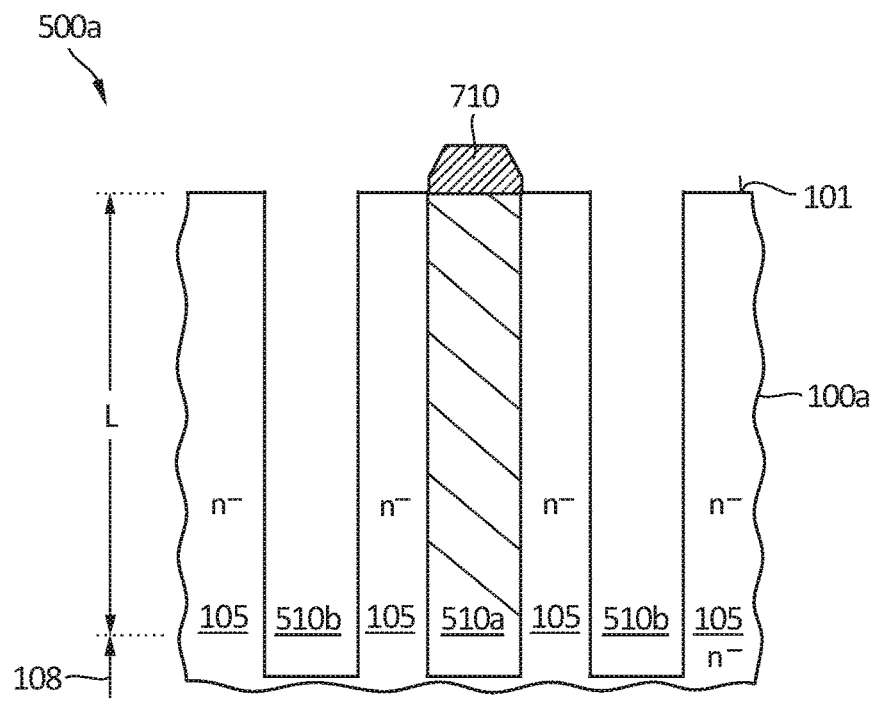
FIG. 7D is a schematic cross-sectional view of the semiconductor substrate portion of FIG. 7C, after recessing fill material in the second trenches.

Another embodiment may provide a temporary fill of the first trenches 510a before providing the implant mask 710. For example, FIG. 7B shows that both the first and the second trenches 510a, 510b are filled with one or more sacrificial materials which may be or may include dielectric, conductive, or intrinsic semiconductor materials before depositing the mask layer. The sacrificial fill in the second trenches 510b is at least partly recessed before the implants as shown in FIGS. 7C and 7D and the sacrificial fill in the first trenches 510a is at least partly recessed after the implants.

A further embodiment may provide a final fill of the first trenches 510a before providing the implant mask 710. A dielectric layer may be provided after the trench etch. The dielectric layer lines the trenches 510a, 510b and may provide the gate dielectric in the finalized device. A conductive material such as polycrystalline silicon is deposited and recessed to fill the trenches 510a, 510b. The conductive material may provide the gate electrodes in the finalized device. After deposition and patterning of the mask layer the implant mask 710 covers the conductive material in the first trenches 510a and exposes the conductive material in the second trenches 510b. Before the first implant an etch process using the implant mask 710 as an etch mask may remove the conductive material from the second trenches 510b provided for the formation of field electrodes. The etch process may use the dielectric layer as an etch stop.

Figure 7E:
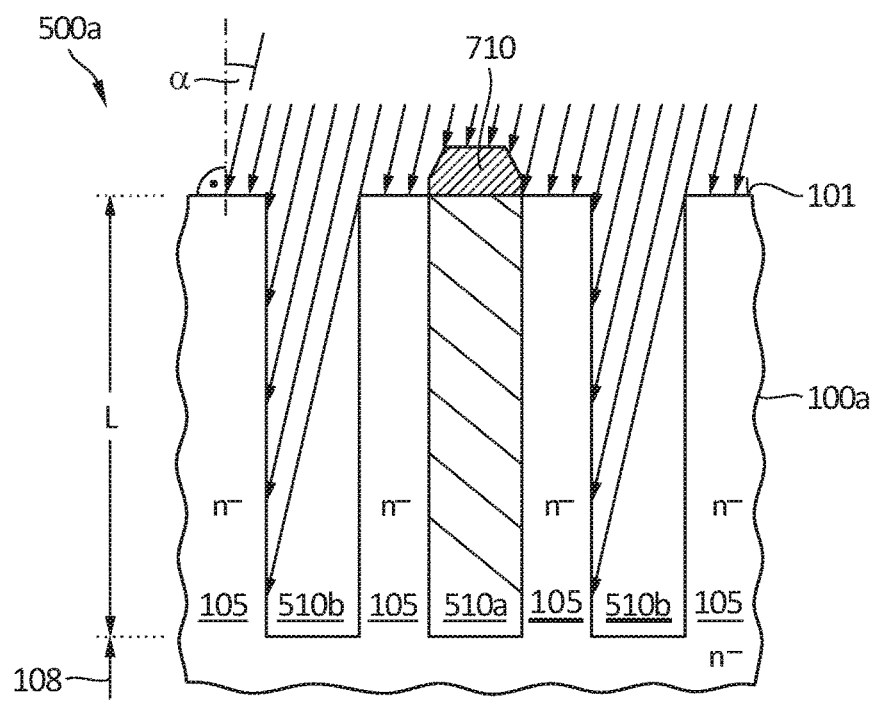
FIG. 7E is a schematic cross-sectional view of the semiconductor substrate portion of FIG. 7D, during a first tilted implant.

FIG. 7E shows the implant mask 710 covering a first trench 510a and exposing second trenches 510b. The first trench 510a may be completely or partially filled with the material of the implant mask 710 or with a dielectric layer and a conductive material providing the gate dielectric and the gate electrode of the finalized device. The first implant is effective only at second sidewalls of mesa sections 105 oriented to second trenches 510b provided for the formation of field electrodes.

A second implant is performed at a second implant angle β equal to or greater than arctan (W/L) and opposite to the first implant angle α.

Figure 7F:
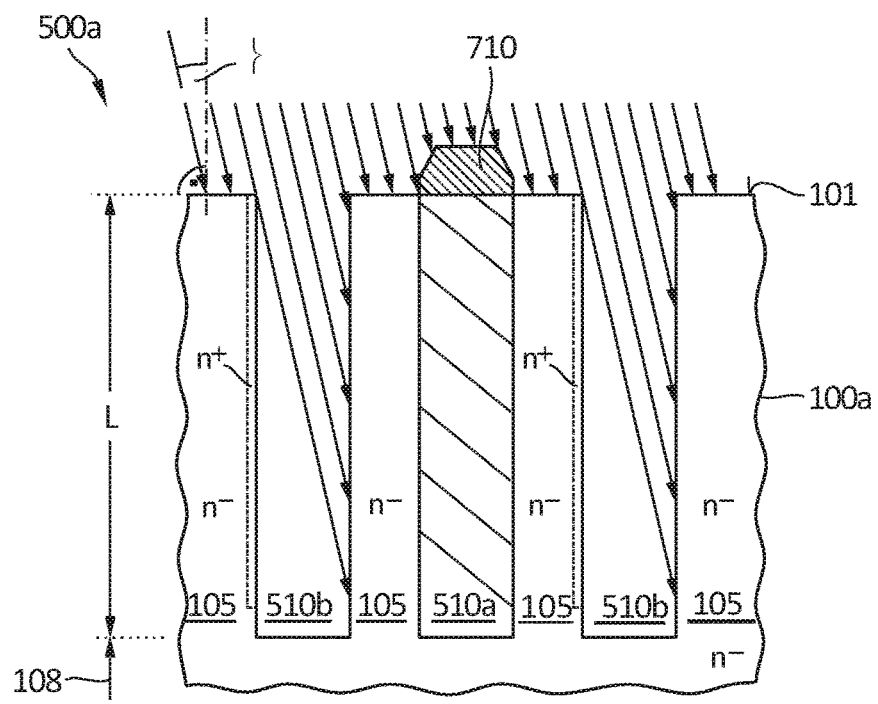
FIG. 7F is a schematic cross-sectional view of the semiconductor substrate portion of FIG. 7E during a second tilted implant.

FIG. 7F shows a second implant performed at an implant angle β with β=−α using the implant mask 710. The second implant is effective only at first sidewalls of mesa sections 150 oriented to the second trenches 510b.

Figure 7G:
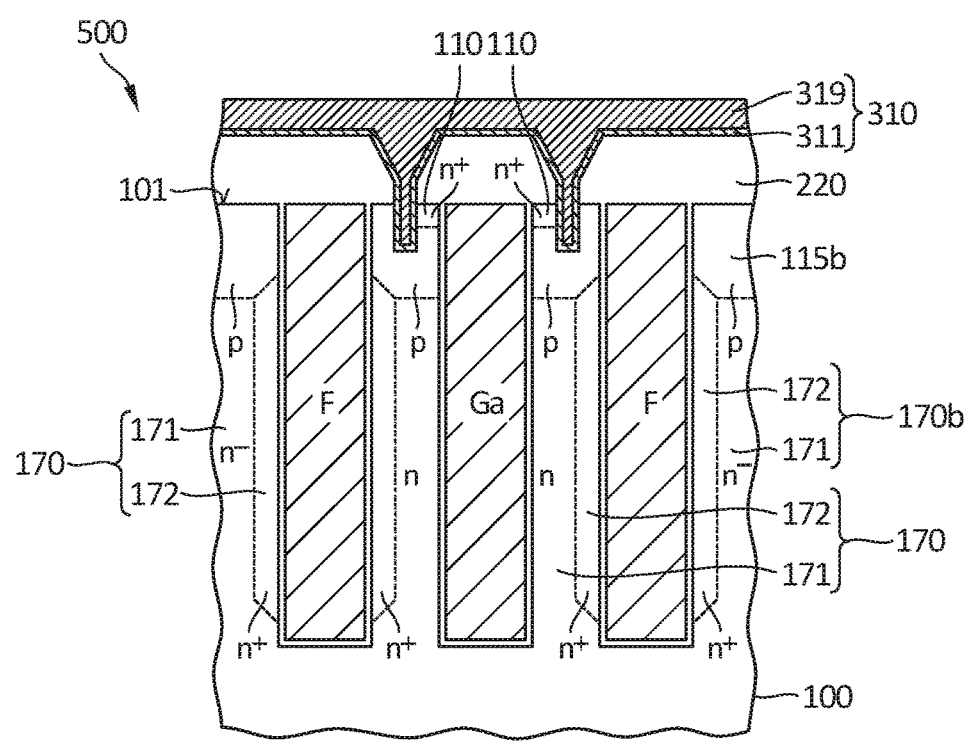
FIG. 7G is a schematic cross-sectional view of a portion of an IGBT manufactured according to the method of FIGS. 7A-7F.

FIG. 7G shows an IGBT 500 resulting from the process described in FIGS. 7A to 7F. The heavily doped second portions 172 in the doped portions 170 in the active mesa sections 105 and in the secondary doped portions 170b in inactive ancillary mesa sections 105 directly adjoin cell trench structures 510 including field electrodes F. No heavily doped second portion 172 is formed along cell trench structures 510 including gate electrodes Ga.

FIGS. 8A to 8D refer to a method of virtually narrowing the mesa sections 105 with heavily doped second portions 172 of the doped region 170 at a distance to both the body region 115 and the drift layer 120.

Provisional trenches 510y are introduced from a first surface 101 into a semiconductor layer 100a of a semiconductor substrate 500a as described with reference to FIG. 6A. The provisional trenches 510y have a vertical length l1 smaller than a vertical extension L of cell trench structures in the finalized device. For example, the vertical extension l1 may be greater than 0.25×L and less than 0.75×L.

FIG. 8A shows the provisional trenches 510y with the vertical extension l1.

N-type impurities are introduced by a vertical implant, by a gas-phase diffusion, by out diffusion from a highly n-doped sacrificial layer or by using spin-on dopants. An impurity mask may cover the first surface 101 outside the provisional trenches 510y during introduction of the n-type impurities. Alternatively, impurities introduced in the first surface 101 outside the provisional trenches 510y may be removed, for example by an etch or grinding process.

FIG. 8B shows a vertical implant as an embodiment for introducing the impurities through the bottom of the provisional trenches 510y.

A high temperature process may drive the implanted impurities into adjoining portions of the semiconductor layer 100a.

FIG. 8C shows the resulting provisional impurity zones 172y laterally extending in the sections of the semiconductor layer 100a between the provisional trenches 510y.

The provisional trenches 510y are further recessed. According to an embodiment the recess may extend the provisional trenches 510y down to the vertical extension of the cell trench structures in the finalized device. According to other embodiments, one or more further implants may be performed at different depths of the provisional trenches 510y.

FIG. 8D shows the heavily doped second portions 172 emerging from the implant through the bottom of provisional trenches 510y. The heavily doped second portions 172 can be provided at a distance to the first surface 101 such that no counter-doping takes place in the area of the body region 115. In addition, the second portions 172 may be spaced from the drift layer 120.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an insulated gate bipolar transistor, the method comprising:
   forming trenches extending from a first surface to a layer section in a semiconductor portion; introducing impurities into mesa sections between the trenches; and
   forming, from the introduced impurities, second portions of doped regions separated from source regions by body regions, the source regions electrically connected to an emitter electrode, the second portions having a second mean net impurity concentration exceeding at least ten times a first mean net impurity concentration in first portions of doped regions, wherein the first portions extend continuously along sidewalls of the mesa regions from the body regions to the layer section, respectively.

2. The method of claim 1, wherein introducing the impurities comprises implanting the impurities into the mesa sections at one or more implant angles with regard to a normal on the first surface, wherein the implant angle(s) is/are greater than arctan(W/L) with W being a width of the trenches and L being a vertical extension of the trenches.

3. The method of claim 1, wherein introducing the impurities comprises a plasma diffusion process diffusing the impurities through sidewalls of the mesa sections.

4. The method of claim 1, further comprising:
   filling, before introducing the impurities, the trenches, which comprise first and second trenches;
   providing an implant mask covering the filled first trenches and exposing the filled second trenches;
   recessing at least partly a fill in the second trenches using the implant mask as an etch mask; and
   introducing the impurities by ion implantation that uses the implant mask.

5. A method of manufacturing an insulated gate bipolar transistor, the method comprising:
   forming provisional trenches extending from a first surface into a semiconductor portion;
   introducing impurities into mesa sections between the provisional trenches;
   recessing the provisional trenches to a layer section in the semiconductor portion after the impurities are introduced in a bottom portion of the provisional trenches; and
   forming, from the introduced impurities, second portions of doped regions separated from source regions by body regions, the source regions electrically connected to an emitter electrode, the second portions having a second mean net impurity concentration exceeding at least ten times a first mean net impurity concentration in first portions of the doped regions, wherein the first portions extend continuously, along sidewalls of the mesa sections from the body regions to the layer section, respectively.

* * * * *